(12) United States Patent
Tatah et al.

(10) Patent No.: US 9,940,965 B2
(45) Date of Patent: *Apr. 10, 2018

(54) THERMAL MANAGEMENT OF LASER DIODE MODE HOPPING FOR HEAT ASSISTED MEDIA RECORDING

(71) Applicant: Seagate Technology LLC, Cupertino, CA (US)

(72) Inventors: Karim Tatah, Eden Prairie, MN (US); Mourad Benakli, Eden Prairie, MN (US); James Gary Wessel, Savage, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/061,166

(22) Filed: Mar. 4, 2016

(65) Prior Publication Data

US 2016/0189741 A1 Jun. 30, 2016

Related U.S. Application Data

(63) Continuation of application No. 14/492,802, filed on Sep. 22, 2014, now Pat. No. 9,281,659.

(51) Int. Cl.
*G11B 7/1263* (2012.01)
*G11B 5/09* (2006.01)
(Continued)

(52) U.S. Cl.
CPC .............. *G11B 7/1263* (2013.01); *G11B 5/02* (2013.01); *G11B 5/09* (2013.01); *G11B 5/40* (2013.01);
(Continued)

(58) Field of Classification Search
CPC .............. G11B 5/09; G11B 2005/0005; G11B 2005/0021; H01S 5/06804; H01S 5/0261;
(Continued)

(56) References Cited

U.S. PATENT DOCUMENTS 4,817,098 A * 3/1989 Horikawa .............. G11B 7/126
372/31
5,077,751 A 12/1991 Kudo et al.
(Continued)

FOREIGN PATENT DOCUMENTS

JP 58077272 10/1983
WO WO9953487 10/1999

OTHER PUBLICATIONS

File History for U.S. Appl. No. 14/492,785 as retrieved on Oct. 27, 2016, 100 pages.
(Continued)

*Primary Examiner* — Michael Carter
(74) *Attorney, Agent, or Firm* — Hollingsworth Davis, LLC

(57) ABSTRACT

A method and apparatus provide for determining a temperature at a junction of a laser diode when the laser diode is operated in a lasing state that facilitates heat-assisted magnetic recording, comparing the junction temperature and an injection current supplied during the lasing state to stored combinations of junction temperature and injection current, and determining a likelihood of mode hopping occurring for the laser diode during the lasing state based on the comparison to stored combinations of junction temperature and injection current.

20 Claims, 15 Drawing Sheets

(51) Int. Cl.
*H01S 5/068* (2006.01)
*H01S 5/06* (2006.01)
*H01S 5/026* (2006.01)
*H01S 5/065* (2006.01)
*G11B 5/02* (2006.01)
*G11B 5/40* (2006.01)
*G11B 5/455* (2006.01)
*G11B 5/00* (2006.01)
*H01S 5/024* (2006.01)
*H01S 5/062* (2006.01)

(52) U.S. Cl.
CPC ............ G11B 5/455 (2013.01); H01S 5/0261 (2013.01); H01S 5/0612 (2013.01); H01S 5/0651 (2013.01); H01S 5/06804 (2013.01); H01S 5/06808 (2013.01); G11B 2005/0021 (2013.01); H01S 5/02453 (2013.01); H01S 5/0617 (2013.01); H01S 5/06216 (2013.01)

(58) Field of Classification Search
CPC ... H01S 5/0651; H01S 5/0612; H01S 5/02453
See application file for complete search history.

(56) References Cited

U.S. PATENT DOCUMENTS

| | | | |
|---|---|---|---|
| 6,039,816 A | 3/2000 | Morita et al. | |
| 6,147,795 A | 11/2000 | Derbyshire et al. | |
| 6,355,300 B1 | 3/2002 | Stirniman et al. | |
| 6,944,112 B2 | 9/2005 | Challener | |
| 6,975,472 B2 | 12/2005 | Stover et al. | |
| 7,609,480 B2 | 10/2009 | Shukh et al. | |
| 7,995,425 B2 | 8/2011 | Schreck et al. | |
| 8,149,652 B2 | 4/2012 | Erden et al. | |
| 8,254,212 B2 | 8/2012 | Snyder et al. | |
| 8,310,779 B2 | 11/2012 | Hanchi et al. | |
| 8,514,672 B2 | 8/2013 | Grobis et al. | |
| 8,559,127 B2 | 10/2013 | Gage et al. | |
| 8,675,455 B1 | 3/2014 | Krichevsky et al. | |
| 9,281,659 B1* | 3/2016 | Tatah | H01S 5/06804 |
| 2002/0037020 A1 | 3/2002 | Shimura et al. | |
| 2004/0027728 A1 | 2/2004 | Coffey et al. | |
| 2008/0063016 A1 | 3/2008 | Bhatia et al. | |
| 2008/0218891 A1 | 9/2008 | Gubbins et al. | |
| 2009/0141756 A1 | 6/2009 | Hiremath | |
| 2012/0201108 A1 | 8/2012 | Zheng et al. | |
| 2013/0010821 A1 | 1/2013 | Yokoyama | |
| 2013/0235449 A1 | 9/2013 | Suzuki | |
| 2014/0029396 A1 | 1/2014 | Rausch et al. | |
| 2014/0029397 A1* | 1/2014 | Rausch | G11B 5/6088 369/13.24 |
| 2015/0078409 A1 | 3/2015 | Sugihara et al. | |
| 2015/0262596 A1 | 9/2015 | Zuckerman et al. | |
| 2015/0340053 A1 | 11/2015 | Peng et al. | |
| 2016/0087401 A1* | 3/2016 | Wessel | H01S 5/06804 372/34 |

OTHER PUBLICATIONS

U.S. Appl. No. 14/492,785, filed Sep. 22, 2014, Wessel et al.
U.S. Appl. No. 14/492,802, filed Sep. 22, 2014, Tatah et al.
File History for U.S. Appl. No. 14/492,785 as retrieved on Apr. 12, 2017, 131 pages.
File History for U.S. Appl. No. 14/492,785 as retrieved from the U.S. Patent and Trademark Office Pair System dated Aug. 10, 2017, 192 pages.

* cited by examiner

US 9,940,965 B2

THERMAL MANAGEMENT OF LASER DIODE MODE HOPPING FOR HEAT ASSISTED MEDIA RECORDING

RELATED PATENT DOCUMENTS

This application is a continuation of U.S. Ser. No. 14/492,802, filed Sep. 22, 2014, to which priority is claimed and which is hereby incorporated by reference in its entirety.

SUMMARY

Examples described herein include methods, apparatuses, and techniques related to heat-assisted media recording (HAMR). In one embodiment, a method includes determining a temperature at a junction of a laser diode when the laser diode is operated in a lasing state that facilitates heat-assisted magnetic recording, comparing the junction temperature and an injection current supplied during the lasing state to stored combinations of junction temperature and injection current, and determining a likelihood of mode hopping occurring for the laser diode during the lasing state based on the comparison to stored combinations of junction temperature and injection current.

According to another embodiment, an apparatus includes a laser diode, a sensor, and an analyzer. The laser diode is configured to facilitate heat assisted magnetic recording in a lasing state. The sensor is configured to measure a temperature of a junction of the laser diode. The analyzer is configured to determine a likelihood of mode hopping occurring for the laser diode during the lasing state based on a comparison of the junction temperature and an injection current of the laser diode to stored combinations of junction temperature and injection current.

Another exemplary embodiment is directed to a method that includes supplying an injection current to a laser diode, measuring a temperature of the junction of the laser diode when in a lasing state that facilitates heat-assisted magnetic recording, comparing the monitored junction temperature and the supplied injection current to the stored combinations of junction temperature and injection current, determining if the measured junction temperature and supplied injection current comprises a combination for which mode hopping is likely to occur based upon the comparisons to stored combinations of junction temperature and injection current, and implementing one or more measures to attenuate the effects of or reduce the likelihood of mode hopping during heat-assisted recording.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
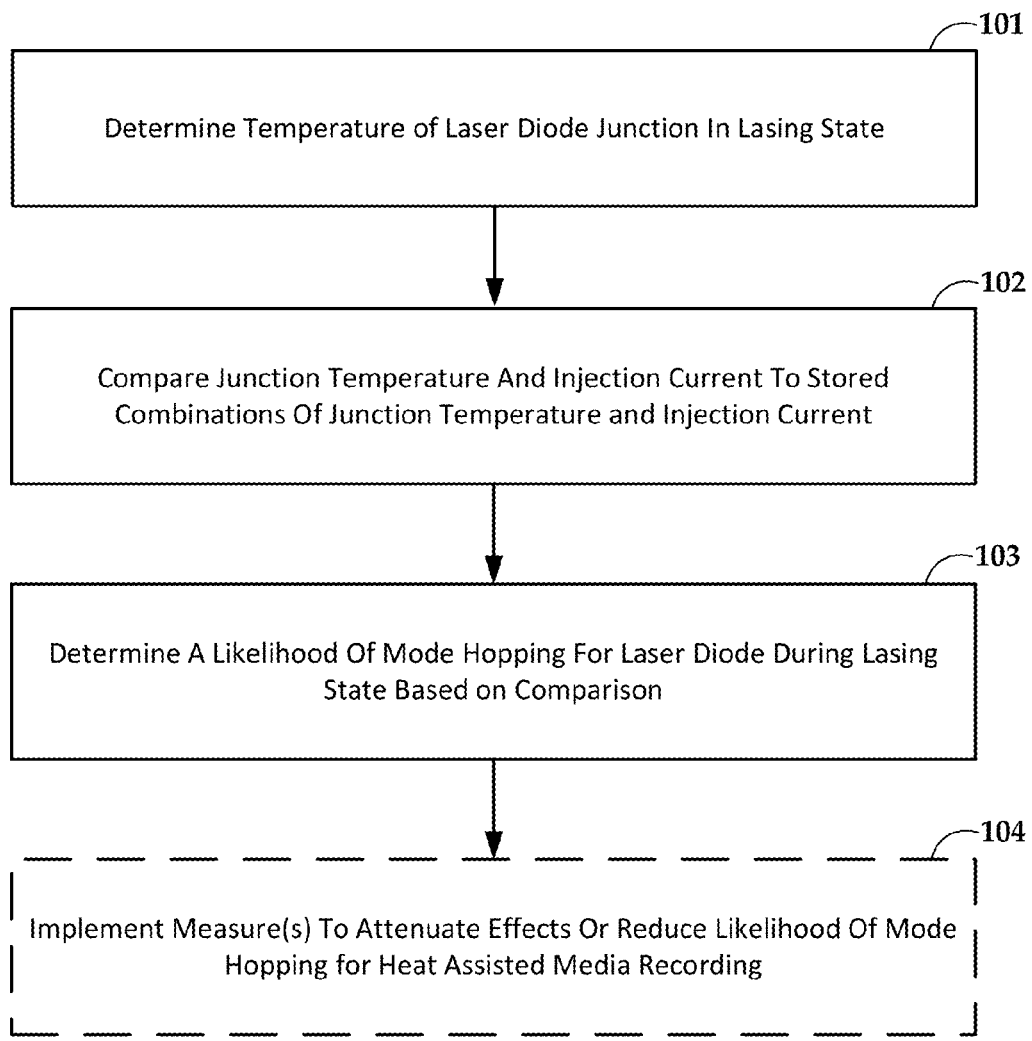
FIGS. 1-4 are flow charts illustrating processes/methods according to example embodiments.

This disclosure describes structures and techniques for mitigating temperature-induced mode hopping of a laser diode used in heat-assisted magnetic recording (HAMR) devices. In particular, some embodiments determine a junction temperature of the laser diode and can have a heating element that warms the junction to mitigate instances of power instability associated with laser diode mode hopping during HAMR. Other embodiments determine the junction temperature of the laser diode and predict a likelihood that mode hopping will occur. One or more measures can be implemented based upon the prediction that mode hopping is likely to reduce its negative impact upon HAMR.

In HAMR devices, also sometimes referred to as thermal-assisted magnetic recording (TAMR) devices or energy assisted magnetic recording (EAMR), a magnetic recording medium (e.g., hard drive disk) is able to overcome super-paramagnetic effects that limit the areal data density of typical magnetic media. In a HAMR recording device, information bits are recorded on a storage layer at elevated temperatures. The heated area in the storage layer determines the data bit dimension, and linear recording density is determined by the magnetic transitions between the data bits.

In order to achieve desired data density, a HAMR recording head (e.g., slider) includes optical components that direct light from a laser diode to the recording media. The HAMR media hotspot may need to be smaller than a half-wavelength of light available from current sources (e.g., laser diodes). Due to what is known as the diffraction limit, optical components cannot focus the light at this scale. One way to achieve tiny confined hot spots is to use an optical near field transducer (NFT), such as a plasmonic optical antenna. The NFT is designed to support local surface-plasmon at a designed light wavelength. At resonance, high electric field surrounds the NFT due to the collective oscillation of electrons in the metal. Part of the field will tunnel into a storage medium and get absorbed, raising the temperature of the medium locally for recording. During recording, a write element (e.g., write pole) applies a magnetic field to the heated portion of the medium. The heat lowers the magnetic coercivity of the media, allowing the applied field to change the magnetic orientation of heated portion. The magnetic orientation of the heated portion determines whether a one or a zero is recorded. By varying the magnetic field applied to the magnetic recording medium while it is moving, data is encoded onto the medium.

A HAMR drive uses a laser diode to heat the media to aid in the recording process. Due to inefficiencies of electric to optical power, the laser diode also heats itself during lasing. Components (writer, reader, heat elements) in the magnetic slider also dissipate heat and the heat is conducted to laser diode as the laser diode submount is mounted on the slider. These components (including the laser diode) can experience significant heating due to light absorption and electric-to-optical conversion inefficiencies as energy produced by the laser diode is delivered to the magnetic recording medium (not shown). During write operation, these light absorption and inefficiencies will vary the junction temperature of the laser diode, causing a shift in laser emission wavelength, leading to a change of optical feedback from optical path in slider to the cavity of the laser diode, a phenomenon that is known to lead to mode hopping/power instability of the laser diode. Mode hopping is particularly problematic in the context of single-frequency lasers. Under some external influences, a single-frequency laser may operate on one resonator mode (e.g., produce energy with a first wavelength) for some time, but then suddenly switch to another mode (produce energy, often with different magnitude, with a second wavelength) performing "mode hopping." Temperature variation is known to cause mode hopping in laser diodes. Some of the physical mechanisms for thermally-induced mode hopping are thought to be temperature dependence of laser gain, index of refraction, and cavity length.

Mode hopping is problematic for HAMR applications, as mode hopping leads to laser output power jumping and magnetic transition shifting from one block of data to another. Large transition shifts in a block of data cannot be recovered in channel decoding, resulting in error bits. This disclosure discusses various techniques, methods, and apparatuses that can be used to predict a likelihood of mode hopping occurring during HAMR. Additionally, various techniques, methods, and apparatuses are disclosed that can be used to mitigate the occurrence of mode hopping and/or reduce the undesirable effects of mode hopping for HAMR applications.

FIG. 1 illustrates an exemplary method that determines a likelihood of mode hopping during HAMR. The method determines 101 a temperature of a junction of a laser diode when in a lasing state that facilitates HAMR. In some instances, the method can determine the junction temperature in a non-lasing state as well as the lasing state. As will be discussed in FIGS. 2 and 3, and in reference to various subsequent FIGURES, the determination of the junction temperature can be made through temperature measurement (utilizing sensors) or calculation. The method utilizes the measured junction temperature and a known injection current supplied to the laser diode during the lasing state to compare 102 the measured junction temperature and injection current to stored combinations of junction temperature and injection current. The stored combinations of junction temperature and injection current will vary from embodiment to embodiment and are dependent upon various criteria including the lasing wavelength, laser diode type, amount of optical feedback, operational temperatures of various components within the drive, etc. Based upon the comparison 102 to the stored combinations of junction temperature and injection current, the method determines 103 a likelihood of mode hopping occurring for the laser diode during the lasing state. Optionally, one or more measures 104 can be implemented to mitigate the effects or reduce the likelihood of mode hopping during HAMR. Some examples of these measures will be discussed in further detail subsequently.

Figure 2:
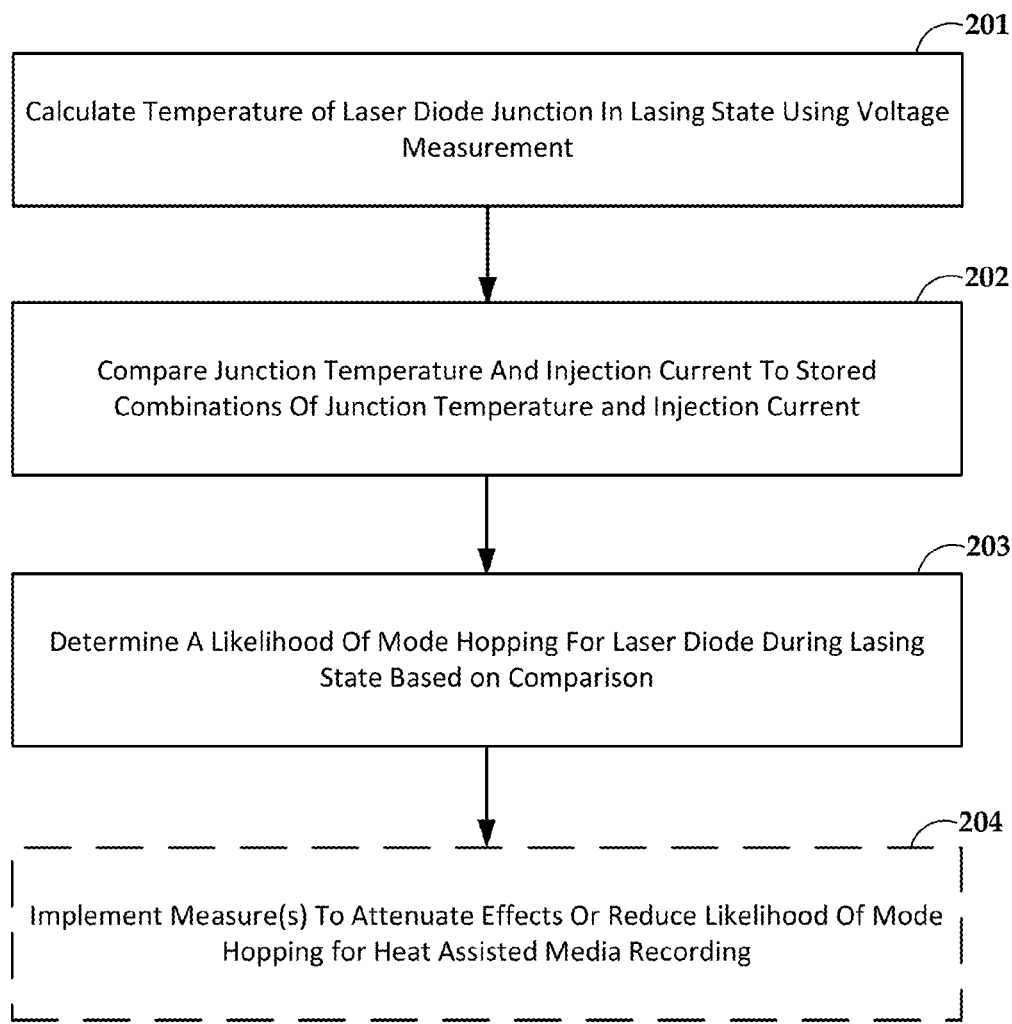

FIG. 2 illustrates another exemplary method that determines a likelihood of mode hopping during HAMR. The method of FIG. 2 calculates 201 the temperature of the junction of the laser diode when in a lasing state that facilitates HAMR. In some instances, the temperature of the junction can also be calculated in a non-lasing state. This determination can be made, for example, by a forward voltage method during the lasing state that is based on the relationship between voltage, current, and laser diode junction temperature. Indeed, the method is based upon the fact that voltage of a constant current is linearly proportional to the junction temperature. Laser diode injection current is a known quantity as it is controlled. Laser power output can be measured, by for example, a laser power monitor (e.g. a photodiode) or other methods. One method of calculating the junction temperature from the power output and the current will be discussed subsequently in reference to FIGS. 5 and 5A.

The method of FIG. 2 compares 202 the measured junction temperature and a known injection current supplied to the laser diode during the lasing state to stored combinations of junction temperature and injection current. Based upon the comparison 202, the method determines 203 a likelihood of mode hopping occurring for the laser diode during the lasing state. As with the embodiment of FIG. 1, various measures 204 can be implemented to mitigate the effects or reduce the likelihood of mode hopping during HAMR.

Figure 3:
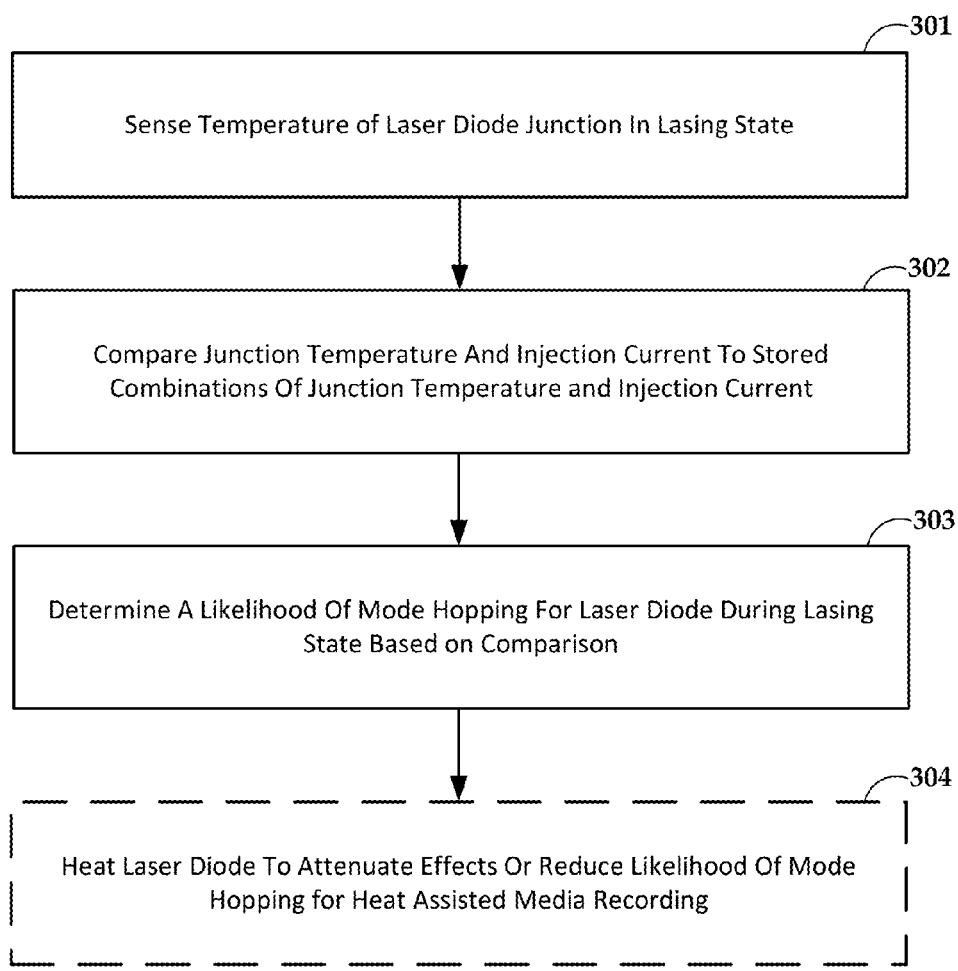

FIG. 3 illustrates yet another exemplary method for determining a likelihood of mode hopping during HAMR. The method of FIG. 3 measures 301 the temperature of the junction of the laser diode when in a lasing state that facilitates HAMR. Measurement of the junction temperature can be made during the non-lasing state as well. The measurement can be performed using a sensor (e.g., a thermistor as discussed in reference to FIG. 6). The method compares 302 the measured junction temperature and a known injection current supplied to the laser diode during the lasing state to stored combinations of junction temperature and injection current. Based upon the comparison 302, the method determines 303 a likelihood of mode hopping occurring for the laser diode during the lasing state. The method specifies one of various optional measures, heating 304 the laser diode, which can be used to reduce the likelihood of mode hopping.

Figure 4:
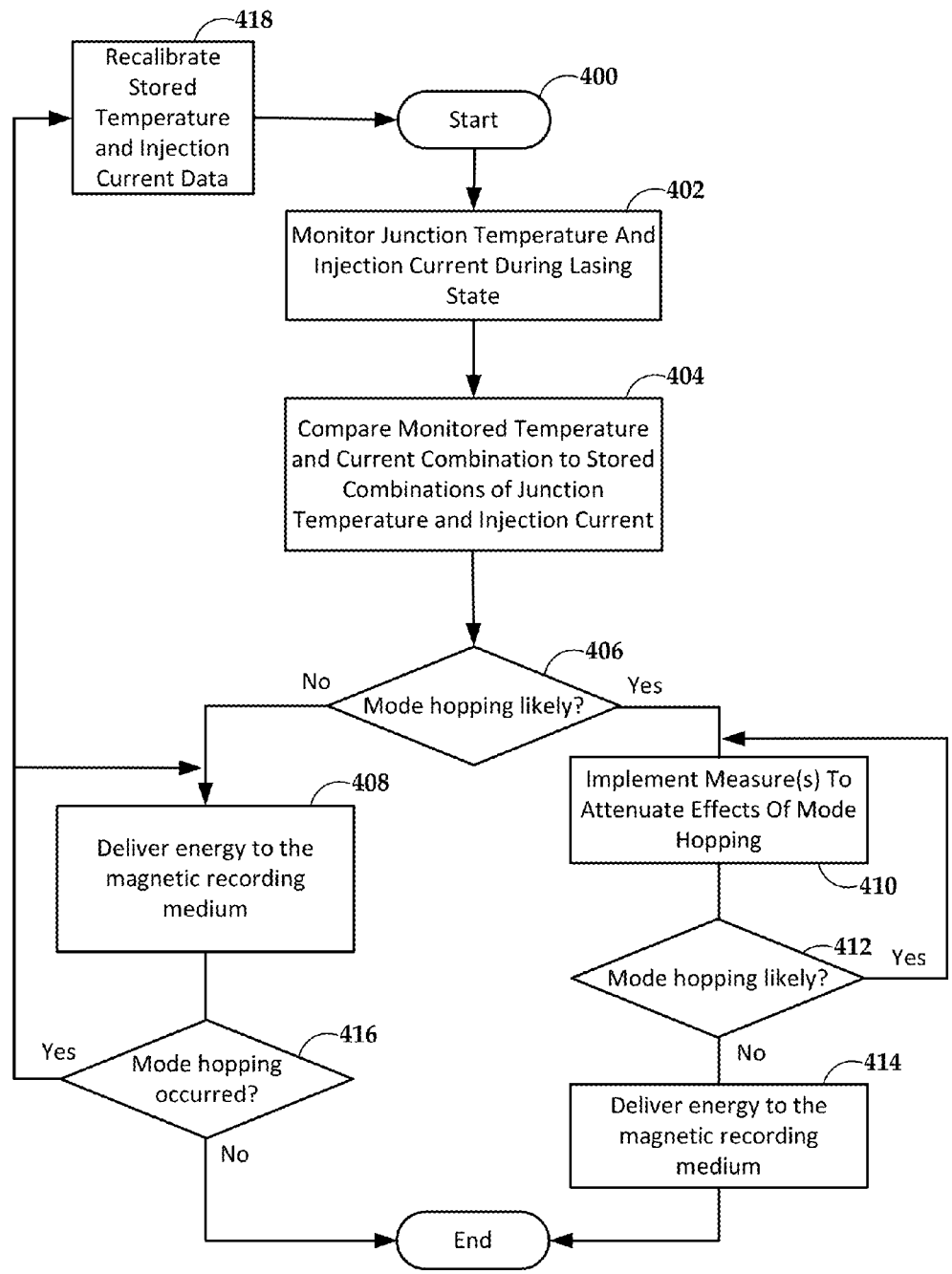

FIG. 4 illustrates a flow chart of according to another method. The method proceeds from start 400 and monitors 402 the junction temperature and an injection current of the laser diode during the lasing state. The monitored junction temperature and the injection current are compared 404 to stored combinations of junction temperature and injection current. In some instances, the stored data can additionally include information regarding slider/head temperatures, case temperatures, magnetic recording medium temperatures, etc. that can be used with the stored injection current information. The method determines 406 if the measured junction temperature and injection current comprises a combination for which mode hopping is likely to occur based upon the comparisons to stored combinations of junction temperature and injection current. If mode hopping is unlikely, the method proceeds to allow the laser diode to deliver 408 energy to the magnetic recording medium using an appropriate injection current. However, if mode hopping is determined to be likely, the method proceeds to implement measures 410 to mitigate the effects or reduce the likelihood of mode hopping. These measures can include one or more of: heating or cooling the laser diode, adjusting laser injection current higher or lower to avoid a combination of junction temperature and injection current for which mode hopping is likely to occur, temporarily stopping writing or holding operation until the junction temperature is reduced, preheating the laser diode by turning it on prior to writing data tracks, etc. Preheating of the laser diode can include applying a power that is below a lasing threshold to the laser diode if a small amount of heating of the junction is desired, or moving the head to a position where data can be overwritten and applying a full lasing power to the laser diode if a larger amount of heating of the junction is desired. After one or more of the measures 410 has been applied, a second check 412 can be performed to determine if the measured junction temperature and injection current comprises a combination for which mode hopping is likely to occur based upon the comparisons to stored combinations of junction temperature and injection current. If mode hopping is determined to be likely, further measures 410 to mitigate the effects or reduce the likelihood of mode hopping can be implemented. If mode hopping is determined to be unlikely, the method proceeds to deliver energy to the magnetic recording medium 414.

Additionally, the method can be provided with redundancy or another check after writing of a data sector is complete such as illustrated in step 416. Step 416 determines if a combination of junction temperature and injection current for which mode hopping was likely to have occurred was inadvertently crossed during energy delivery 408. In some instances, if such a combination was found to have occurred, the sector of data affected can be rewritten at step 408. In other instances, if a comparison of the measured junction temperature and injection current to stored combinations of junction temperature and injection current indicates mode hopping was unlikely to have occurred, yet additional monitoring/analysis (e.g., optical power monitoring, review of recorded data, laser wavelength monitoring) indicates mode hopping was likely to have occurred, the method can proceed to recalibrate 418 the stored temperature and injection current data to allow for a better identification of mode hopping based upon the measured junction temperature and injection current can be performed.

Figure 5:
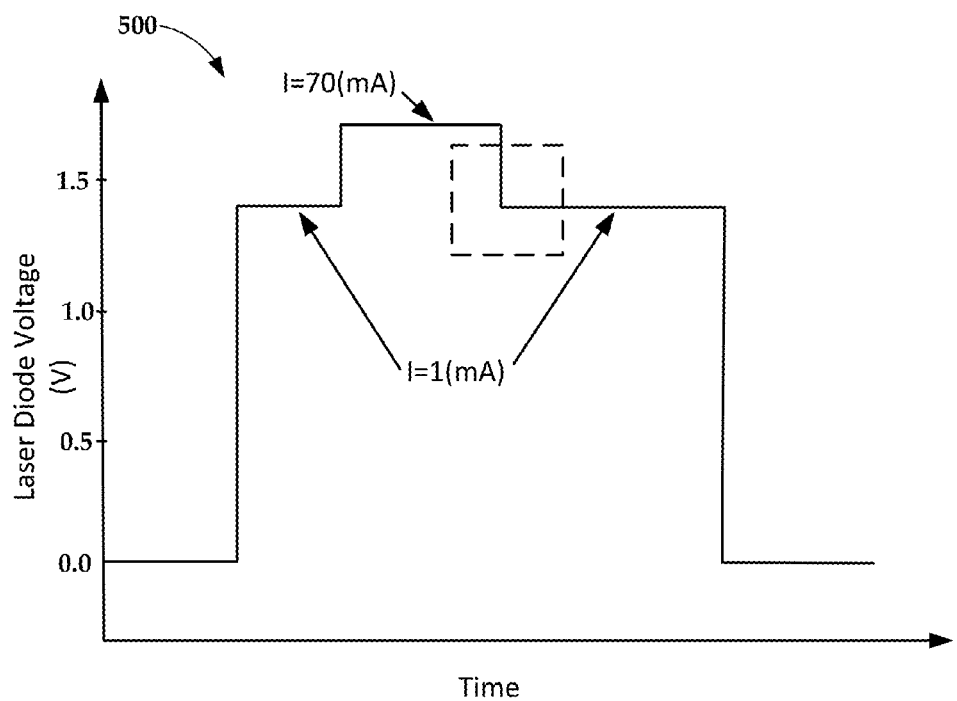
FIG. 5 is graph of a laser diode voltage over time at various known substantially constant current levels.
Figure 5A:
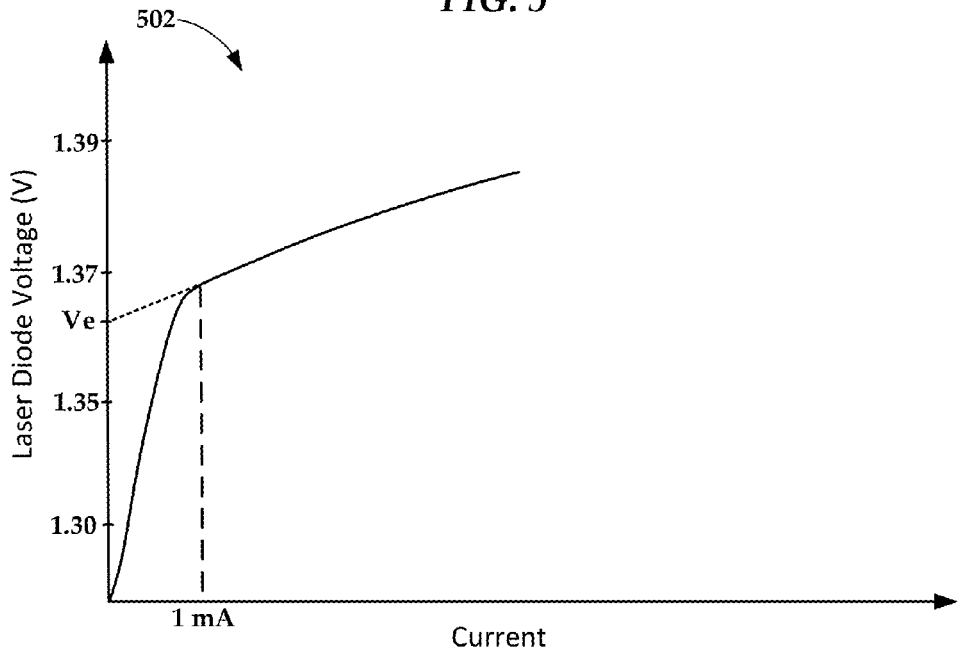
FIG. 5A is a graph of laser diode voltage against injection current for the embodiment of FIG. 5.
Figure 5B:
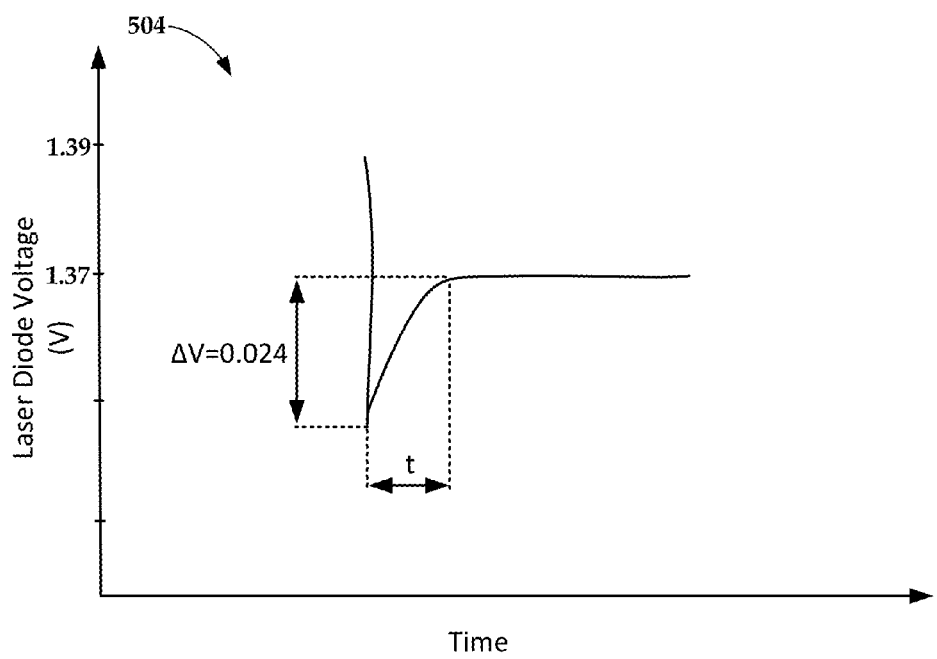
FIG. 5B is an enlargement of the graph of FIG. 5 showing a transition between voltage states.

FIGS. 5, 5A, and 5B illustrate graphs 500, 502, and 504 that provide an example of how the temperature of the junction of the laser diode can be calculated. This technique does not rely on sensors (e.g. thermistor) for monitoring and indeed performs no sensing during the non-lasing state. The technique allows for determination of a junction temperature of the laser diode in both the lasing state and the non-lasing state. The technique is based on the relationship between voltage, current, and laser diode junction temperature (i.e., voltage at low constant (~1 mA) current is linearly proportional to the junction temperature). Laser diode current is a known quantity as it is controlled as illustrated in FIG. 5. Laser power output can be measured, by for example, a laser power monitor (e.g. a photodiode), analyzing patterns in recorded data to deduce power variation, etc.

FIG. 5 provides a graph where current is increased such that laser diode voltage increases from zero to substantially a steady state (e.g., about 1.37 V) and held at this steady state for a period of time. In the embodiment of FIG. 5, the current is increased to a high current such that voltage is also increased. This lasing state is held at a high power state for a period of time sufficient for junction temperature to adjust and then the current is abruptly returned to a lower current state (e.g. back to the 1 mA state) and held in that state for a period of time to allow for return of a steady state voltage and an adjustment of junction temperature.

FIG. 5A provides a graph 502 of the laser diode voltage measured against injection current for the embodiment described in FIG. 5. The graph 502 illustrates that voltage increases rapidly from zero until a voltage associated with the steady state (e.g., about 1.37 V) turn-on voltage is reached. Because constant current is linearly proportional to the junction temperature, a voltage, $V_e$, associated with the low current state can be extrapolated by fitting a linear line back from the steady state voltage.

FIG. 5B provides an enlargement of a portion of FIG. 5 where the current is suddenly reduced from the maximum state and then pulsed up to the lower current state. The pulse illustrated in FIG. 5B has a time duration t in the hundreds of nanosecond in some instances. FIG. 5B illustrates that the voltage dips measurably for a transient temperature period (e.g., t) before returning toward a steady state voltage provided by the constant current. In FIG. 5B, the amount of this dip $\Delta V=0.024$ is provided for exemplary purposes. Because voltage of a constant current is linearly proportional to the junction temperature, the amount of $\Delta V$ provides a measure of $\Delta T$ at the junction of the laser diode. The technique involves a calibration step in which a proportionality factor K is determined. This can be accomplished by measuring forward voltage in a first state where temperature is known (e.g., at a room temperature where the laser is driven by a very low known constant current, for example, 1 mA or less as illustrated) and, for example, at a second known voltage state (e.g., a high voltage or zero voltage $V_e$). The temperatures during these voltage states can be measured by a sensor (e.g., thermistor, etc.).

The proportionality factor K can be calculated according to Equation (1) as follows:

$$K=(V_1-V_2)/(T_2-T_1) \qquad (1)$$

where $V_1$ is the voltage measured during the first state (e.g., a room temperature state), $V_2$ is the voltage measured during the second state (e.g., a high voltage state, a zero voltage state, etc.), $T_2$ is the temperature measured during the second state, and $T_1$ is the temperature measured during the first state.

Once the proportionality factor K has been determined for the laser diode, given a sensed $\Delta V$, $\Delta T$ can be calculated as changes in current are known. As illustrated in FIG. 5B, the forward voltage can be measured before and after heating by a high pulsed drive current to determine $\Delta V$. Thermal impedance ($R_{Thermal\ Impedance}$) can be calculated according to Equation (2) as:

$$R_{Thermal\ Impedance}=K^{-1}*[\Delta V/P_{heat}] \qquad (2)$$

where $\Delta V=V_{before\ pulse}-V_{after\ pulse}$ and $P_{heat\ from\ pulse}$ is the power expended during the heat pulse. The power expended during the heat pulse $P_{heat\ from\ pulse}$ can be calculated according to Equation (3):

$$P_{heat\ from\ pulse}=(\Delta I*\Delta V)-P_{light} \qquad (3)$$

where $\Delta I$ is the change in current applied during the pulse, and $P_{light}$ is the change in lasing power measured during the pulse by, for example, a photodiode or another sensor or method. In short, the forward voltage technique described determines a voltage differential between a transient voltage lasing state of the laser diode and a constant voltage lasing state of the laser diode (as measured just prior to and just after a high pulsed drive current is applied). The forward voltage technique calculates the temperature differential based on the voltage differential using the proportionality factor K and the assumption that the temperature differential between the transient voltage lasing state and the constant voltage lasing state is relatively minimal (i.e. and some cases can be assumed to be zero) due to the relatively slower diffusion of heat along the junction as compared with faster response of electrical signals.

Figure 6:
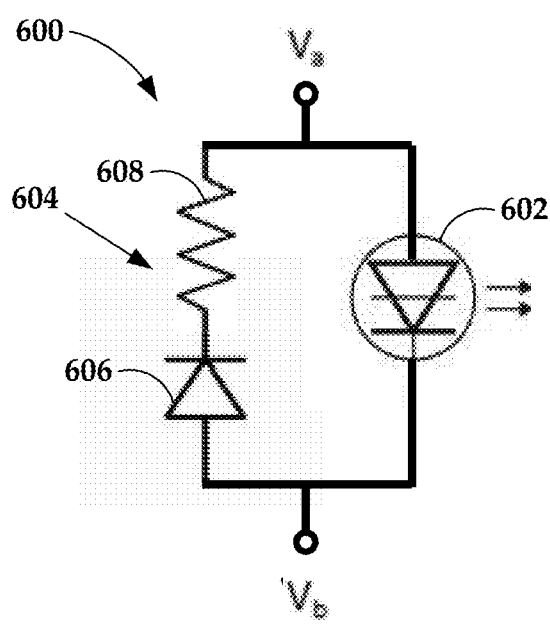
FIG. 6 is a schematic that includes a laser diode coupled in parallel with a heater arrangement according to an example embodiment.

FIG. 6 is a simplified circuit arrangement 600 that electrically couples a laser diode 602 and a heater arrangement 604 in a parallel relationship. The heater arrangement 604 can be disposed proximate the laser diode 602 (e.g. in, along, or adjacent thereto) and can be used to heat the laser diode 602. Indeed in some instances the spatial proximity of the heater arrangement 604 to the junction of the laser diode 602 is such that heat can diffuse quickly (e.g., <1 μs) to the laser junction and maintain a smaller laser junction temperature variation. Thus, in some instances the heater arrangement 604 can be positioned in or along the laser diode 602 itself. In other instances, the heater arrangement 604 can be disposed on adjacent components such as the transducer head, etc. In the embodiment shown in FIG. 6, the heater arrangement can comprise a diode 606 coupled in series with a heater/thermistor 608. However, in some embodiments the heater arrangement can be comprised of only a diode (e.g. FIG. 8). The heater/thermistor 608 can allow the heater arrangement 604 to act as a temperature sensor of the junction temperature of the laser diode 602 (at least during a portion of the non-lasing state) in addition to providing heating to the junction. In some cases, the temperature sensor can be configured to measure a temperature of the junction of the laser diode in one or both of the lasing state and the non-lasing state.

As illustrated in FIG. 6, the circuit 600 is configured to alternately operate the laser diode 602 in a lasing state and a non-lasing state, and to activate the heater arrangement 604 during the non-lasing state to warm a junction of the laser diode 602. In the embodiment of FIG. 6, the heater arrangement 604 includes the diode 606, which is configured/arranged to be reverse biased during the lasing state and forward biased during the non-lasing state for the laser diode 602. Thus, the heater arrangement 604 and circuit 600 are configured to provide heating to the laser diode 602 during the non-lasing state and the heater arrangement 604 is configured to warm the laser diode junction to a temperature associated with a reduced risk of mode hopping of the laser diode 602. The heater arrangement 604 can be controlled (e.g., through a pre-amp current driver) to maintain the temperature at the junction within a predetermined temperature range.

Using the circuit 600 and components (e.g., diode 606 and heater/thermistor 608) of FIG. 6, the junction temperature can be measured during the non-lasing state. The junction temperature during the lasing state can be measured by another sensor (e.g. thermistor, photodiode, etc.), the heater/thermistor 608, and/or the diode 606 in some instances. Thus, the diode 606 can function as a temperature sensor in some embodiments. Junction temperature can be measured when the laser diode 602 is in the lasing state and the non-lasing state. Based upon the measured junction temperatures during the lasing state and the non-lasing state, a drive signal can be applied to the heater arrangement 604 to provide heating to the laser diode 602 during at least the non-lasing state as the diode 606 is configured to be reverse biased during the lasing state and forward biased during the non-lasing state.

Figure 7:
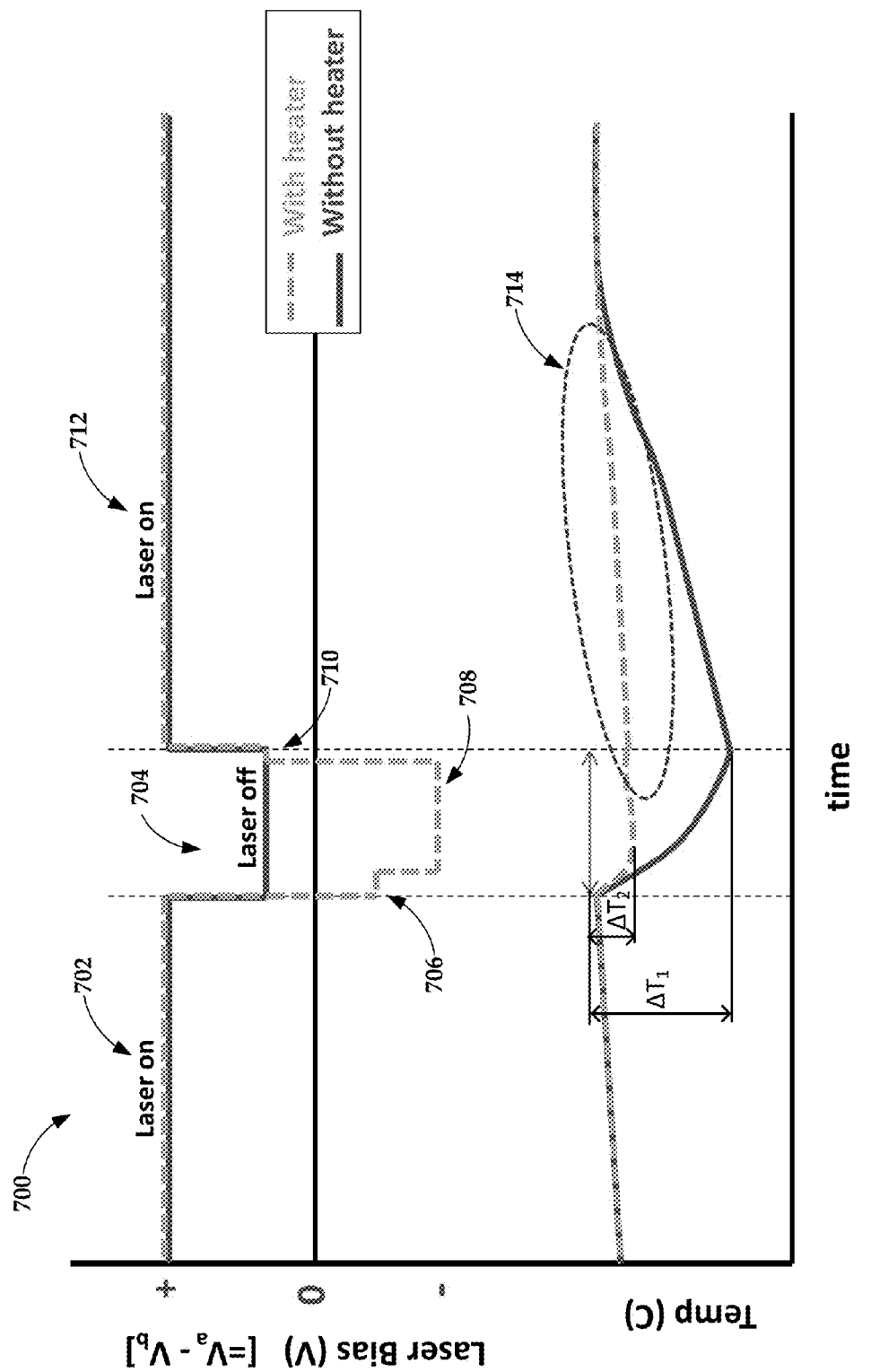
FIG. 7 is a graph of laser bias and temperature over time with and without heating applied thereto according to an example embodiment.

FIG. 7 is a graph 700 of laser bias, $V=[V_a-V_b]$, and laser junction temperature for the circuit 600 and components (e.g., laser diode 602) of FIG. 6 (indicated in FIG. 7 as "with heater") as compared to a circuit and a laser diode that are not part of such an arrangement (indicated in FIG. 7 as "without heater"). As illustrated in FIG. 7, both arrangements (circuit with heater, and circuit without heater) operate with the same laser bias voltage and junction temperature during a first laser on period 702. However, during a laser off period 704, the heater arrangement 604 (diode 606) is forward biased (e.g., provided with negative bias from the laser perspective). During the initial time period of the laser off period 704, the heater arrangement 604, with the heater/thermistor 608, acts in a thermistor mode 706 to measure the laser temperature at the junction (in addition to providing heating thereto). Thus, the heater/thermistor 608 serves as a temperature sensor for the laser diode junction at least during a portion of the non-lasing state. In some cases, sensing can be accomplished during a lower laser bias level than during heater mode 708, as illustrated in FIG. 7. One or both of the thermistor mode 706 and the heater mode 708 may involve application of preheating to the junction during the laser off period 704. When lasing is desired, the laser bias is driven in an opposing direction such that the laser diode 602 is ready for lasing as illustrated by 710. Application of a higher forward bias voltage to the laser diode causes the laser to lase in a laser on mode 712.

FIG. 7 additionally illustrates the difference between junction temperatures of a laser diode without heating and the laser diode 602 with heating. As illustrated in FIG. 7, region 714 of the laser diode 602 experiences a much smaller temperature fluctuation at the junction than the laser diode with no heater. Thus, $\Delta T_2 < \Delta T_1$ (i.e. the temperature differential $\Delta T_2$ of the junction for the laser diode 602 between the lasing state and the non-lasing state is smaller than the temperature differential $\Delta T_1$ of the junction for the laser diode without a heater between the lasing state and the non-lasing state).

Figure 8:
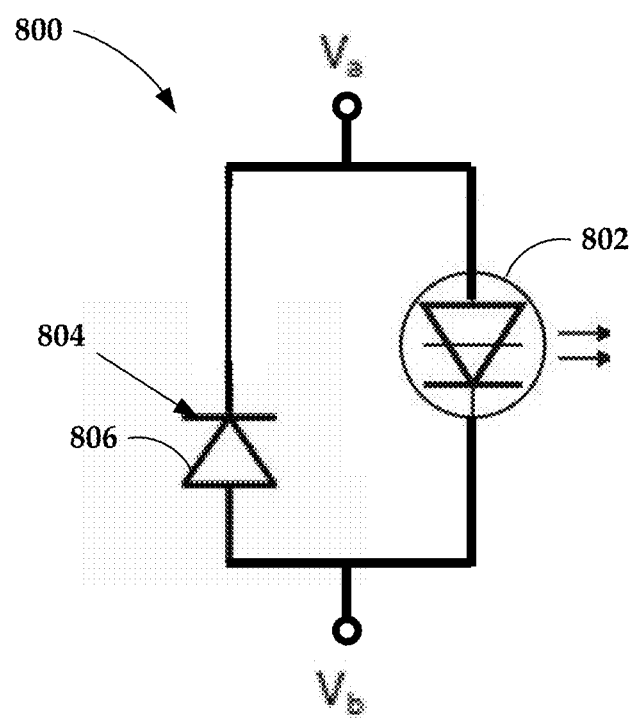
FIG. 8 is a schematic that includes a laser diode coupled in parallel with a heater arrangement according to another example embodiment.

FIG. 8 is a simplified circuit arrangement 800 that electrically couples a laser diode 802 and a heater arrangement 804 in a parallel relationship. FIG. 8 illustrates an embodiment in which current passing through the forward biased diode 806 provides sufficient heat generation for the laser diode 802 during the non-lasing state, without need for an additional heating element (e.g., resistor or thermistor). The circuit arrangement 800 and components are configured in the manner previously discussed with regard to FIG. 6. The heater arrangement 804 of FIG. 8 comprises a diode 806, which is configured to be reverse biased during the lasing state and forward biased during the non-lasing state for the laser diode 802. The diode 806 can also act as a temperature sensor in some embodiments. Thus, the heating arrangement 804 can also be a temperature sensor. The circuit 800 is configured to alternately operate the laser diode 802 in a lasing state and a non-lasing state, and to activate the heater arrangement 804 (e.g. the diode 806) during the non-lasing state to warm a junction of the laser diode 802.

Figure 9:
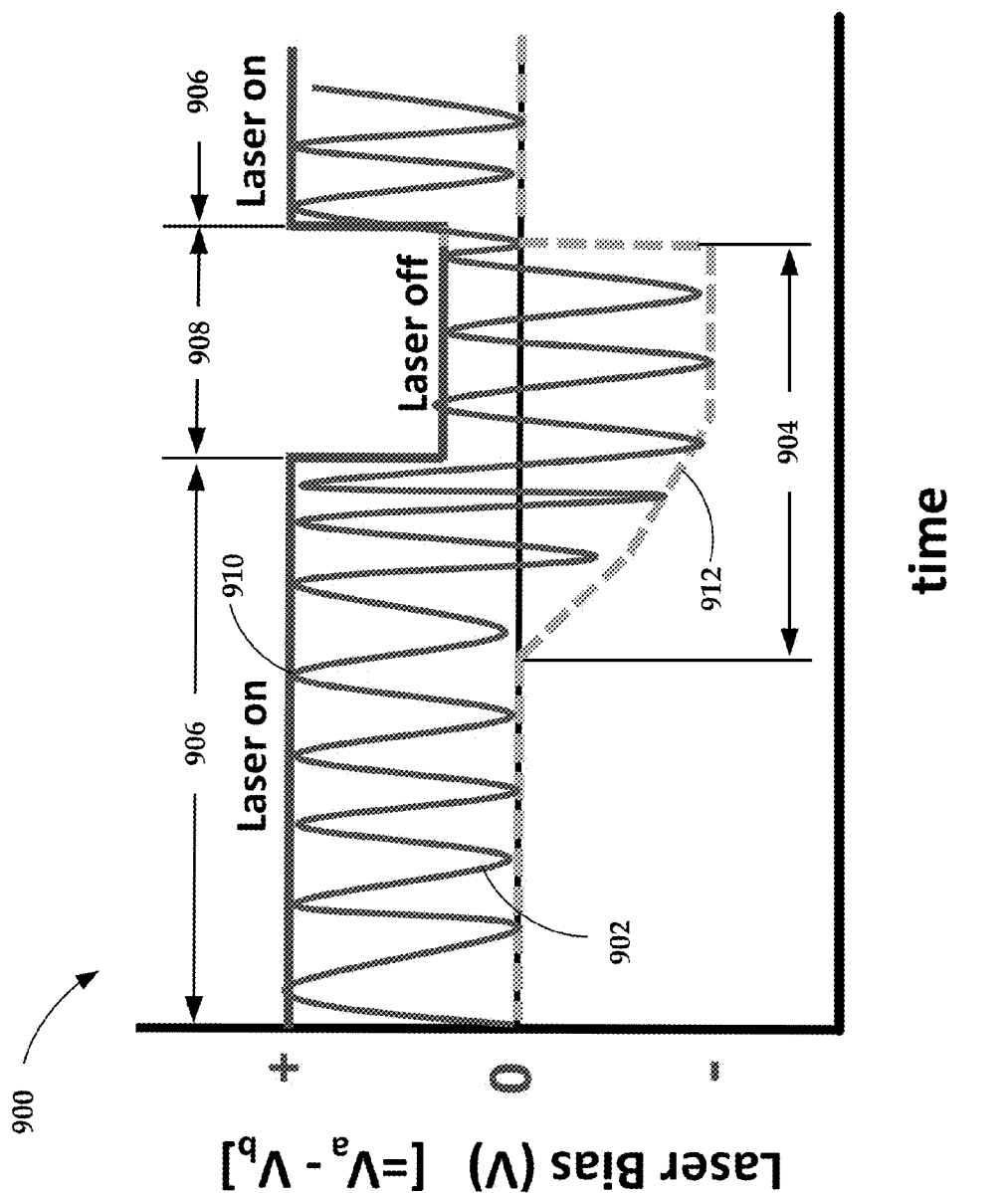
FIG. 9 is a graph of laser bias over time and illustrating an oscillating drive signal including a negative-going portion for forward biasing a heating arrangement according to an example embodiment.

In addition to providing heating to the laser diode junction during the non-lasing state in some embodiments, the embodiments of FIGS. 6 and 8 can also in some scenarios be used to activate the heater arrangement 604, 804 during at least a portion of the non-lasing state and at least a portion of the lasing state to warm the junction of the laser diode 602, 802. FIG. 9 provides a graph 900 of such a scenario. FIG. 9 shows laser bias over time and illustrates an oscillating drive signal 902 including a negative-going portion 904 for forward biasing the heater arrangement 604, 804 to produce heat. In FIG. 9, the generated drive signal 902 has an energizing portion 906 and a non-energizing portion 908 that causes the laser diode 602, 802 to operate in the lasing state and non-lasing state, respectively. As illustrated in FIG. 9, the energizing portion 906 comprises part of the negative-going portion 904 for forward biasing the heater arrangement 604, 804 (e.g. diode 606, 806) during at least a portion of the lasing state. The drive signal 902 can be viewed as having a first envelop 910 defined by the positive amplitude peaks of the drive signal 902. The drive signal 902 can be viewed as having a second envelop 912 defined by the negative amplitude peaks of the drive signal 902. The magnitude of the bias voltage defining the first envelop 910 dictates whether the laser diode is in the lasing or non-lasing state (laser on, laser off). The magnitude of the bias voltage defining the second envelop 912 dictates if and to what extent the heater arrangement 604, 804 (e.g., diode 606, 806) is producing heat. The drive signal 902 can be generated with a frequency and amplitude profile sufficient to produce both lasing and heating as desired. For example, one or both of the bias voltage magnitude and frequency can be selected and adjusted to shape the negative-going heating envelop of the drive signal to achieve a desired level of laser diode heating during at least a portion of the lasing state and the non-lasing state. Analysis indicates that HAMR recording can be successful if the frequency of laser diode bias is higher than approximately the half the drive data-rate. As a numerical example, consider a disc drive with data-rates on the order of 4 gigabits per second. Thus, the minimum frequency for laser diode bias is expected to be on the order of 2 GHz.

Figure 10:
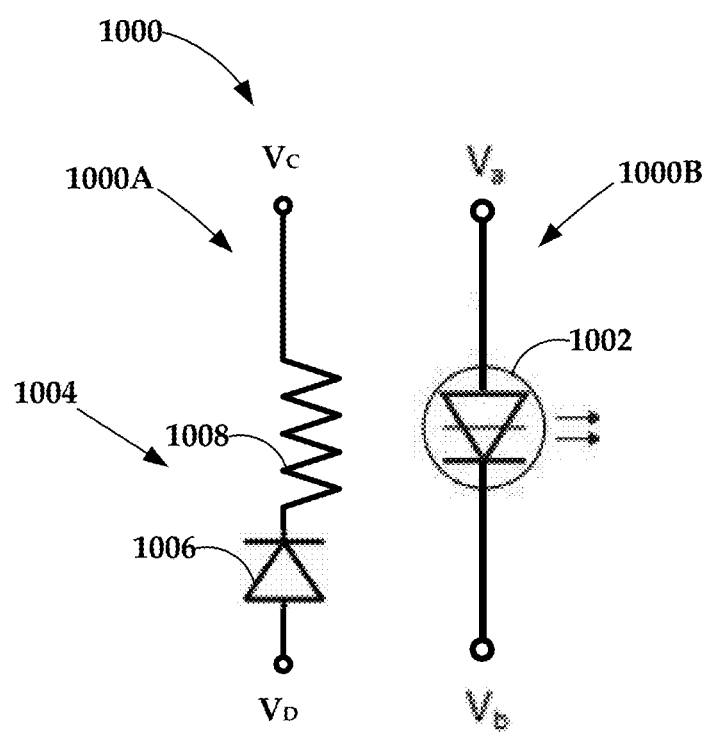
FIG. 10 is a schematic view of a laser diode and a heater arrangement each part of an independent circuit according to yet another example embodiment.

FIG. 10 is another simplified view of two circuits 1000 that are electrically separated from one another yet allow for heat generated by components electrically coupled to a first circuit 1000A to heat components that are electrically coupled to a second circuit 1000B. The second circuit 1000B allows a bias voltage ($V_a$-$V_b$) to be applied to a laser diode 1002. The first circuit 1000A allows a second bias voltage ($V_a$-$V_c$) to be applied to a heater arrangement 1004. The heater arrangement 1004 can be disposed proximate the laser diode 1002 as described previously and can be used to heat the laser diode 1002. Indeed, in some instances the spatial proximity of the heater arrangement 1004 to the laser junction is such that heat can diffuse quickly (e.g., <1 µs) to the laser junction and maintain a small laser junction temperature variation. In the embodiment of FIG. 10, the heater arrangement 1004 can comprise a diode 1006 coupled in series with a heater 1008. However, in some embodiments the heater arrangement 1004 can comprise only a diode, or can comprise a heater/thermistor as previously discussed. In some instances, the diode 1006 can comprise a photodiode arranged to facilitate power monitoring of the laser diode 1002. The photodiode could provide heating of the laser diode during at least the non-lasing state. The heater arrangement 1004 and the first circuit 1000A are configured to provide heating to the laser diode 1002 as desired (e.g., during one or both of the non-lasing state and the lasing state). For example, the first circuit 1000A can be activated during the non-lasing state to heat the laser diode 1002, and during at least an end portion of the lasing state to pre-heat the laser diode 1002 and thereby reduce the junction temperature variation between lasing and non-lasing states. The heater arrangement 1004 can be configured to warm the laser diode junction to a temperature associated with a reduced risk of mode hopping of the laser diode 1002. Additionally, the heater arrangement 1004 can be controlled (e.g., through a pre-amp current driver) to maintain the temperature at the junction within a predetermined temperature range.

Figure 11:
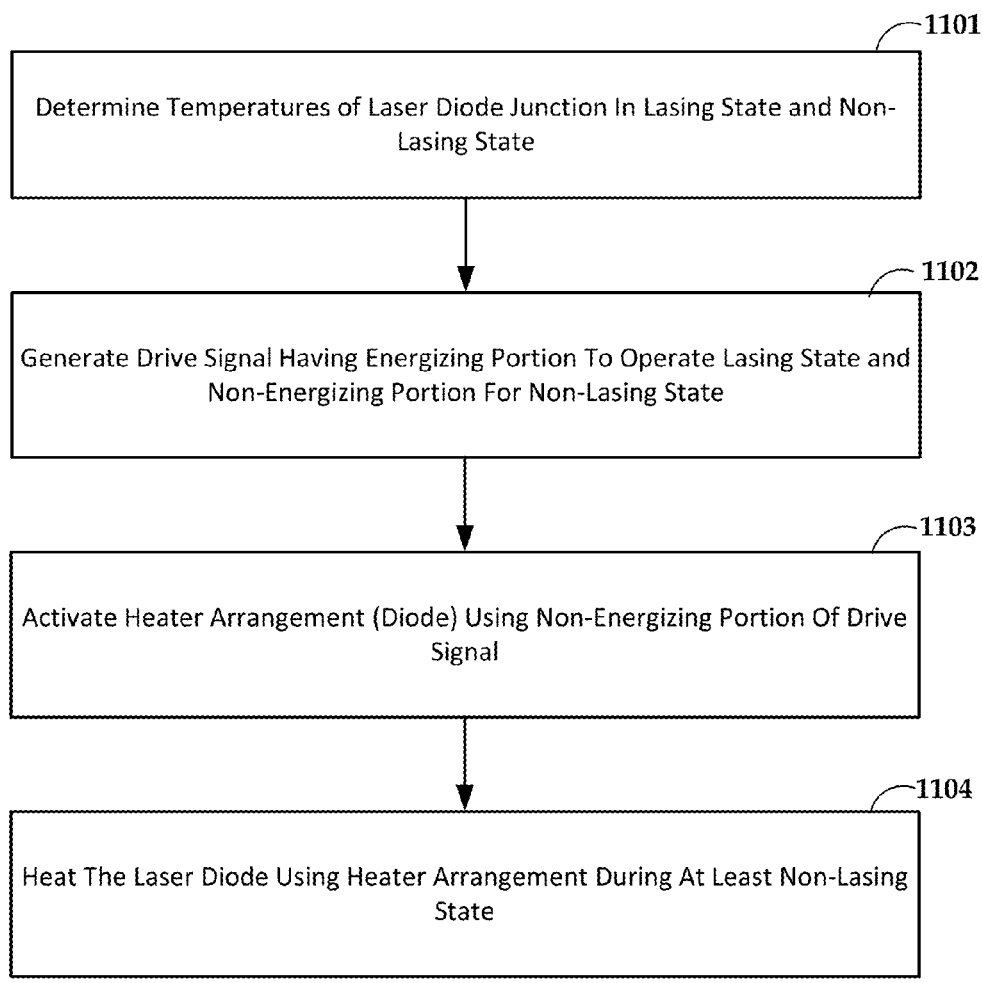
FIG. 11 is a flow chart of a process/method according to an example embodiment.

FIG. 11 illustrates an exemplary method that utilizes a circuit (e.g. 600, 800, 1000, etc.) to measure a junction temperature of and heat a laser diode. The method measures 1101 the junction temperature of a laser diode in a lasing state that facilitates heat assisted recording and in the non-lasing state. The method generates 1102 a drive signal having an energizing portion and a non-energizing portion to cause the laser diode to operate in the lasing state and non-lasing state, respectively. The method activates 1103 a diode of a heater arrangement coupled in parallel with the laser diode using at least the non-energizing portion of the drive signal, and heats 1104 the laser diode using the heater arrangement during at least the non-lasing state. In some cases, the energizing portion can comprise a negative-going portion for forward biasing the diode during at least a portion of the lasing state and the heating of the laser diode can occur during at least a portion of the lasing state. In some instances, the heater arrangement can facilitate measurement of the junction temperature (i.e. act as a temperature sensor). The operation of the heater arrangement can be controlled based upon the measured junction temperature. Heating can occur such that the junction temperature falls within a temperature range associated with a reduced risk of mode hopping of the laser diode.

Figure 12:
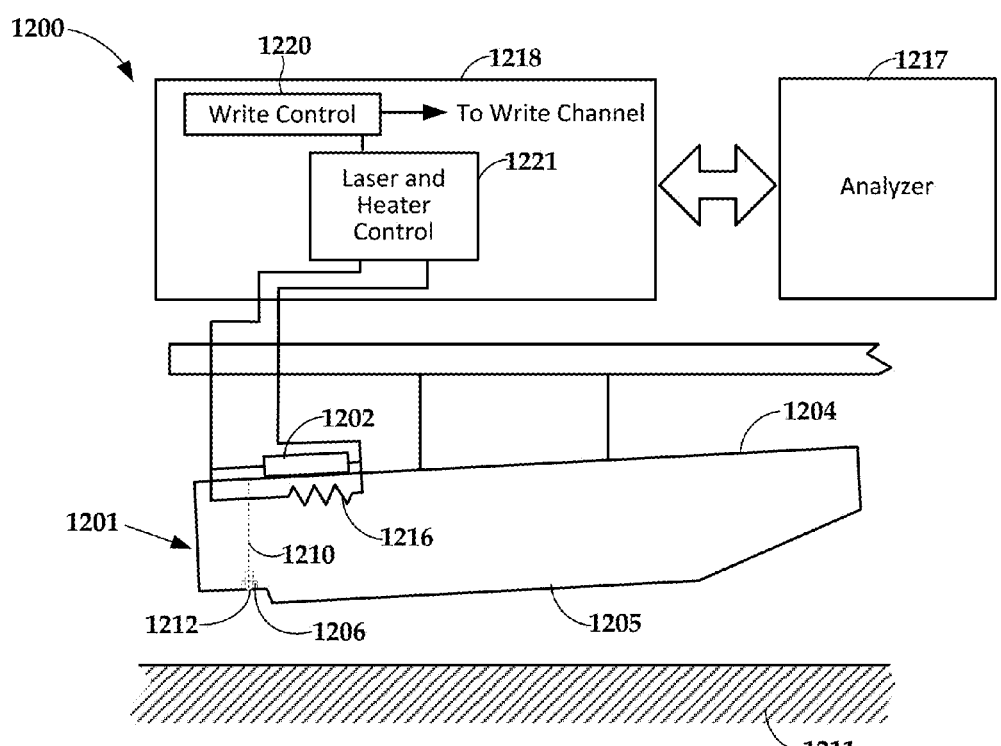
FIG. 12 is a schematic view of an apparatus and related components according to an example embodiment.
Figure 13:
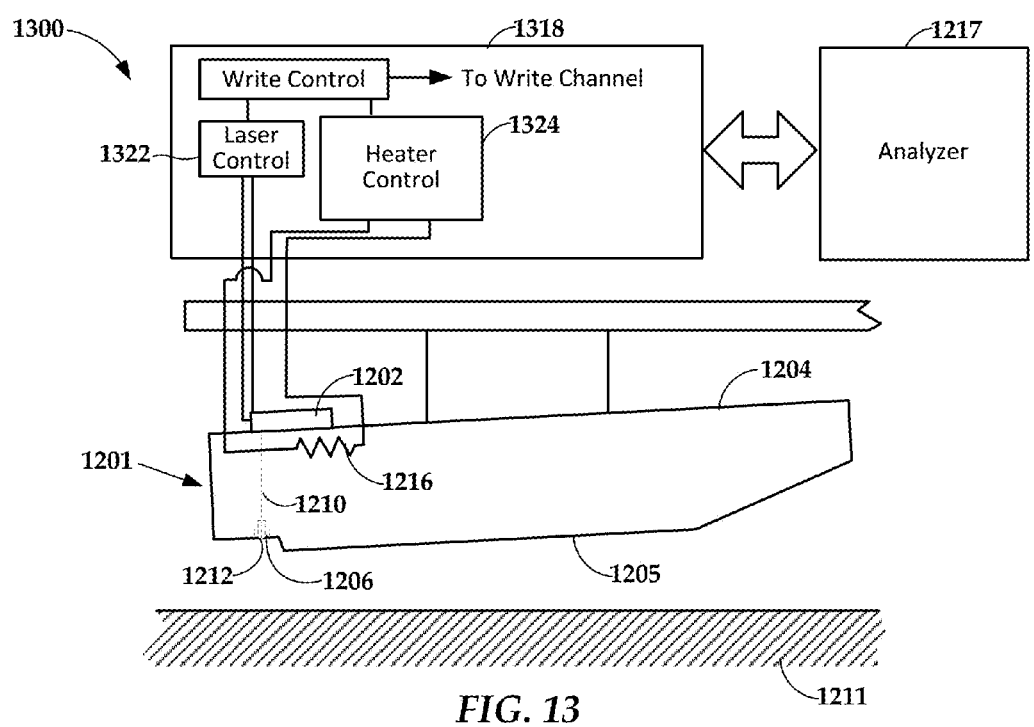
FIG. 13 is a schematic view of an apparatus and related components according to another example embodiment.
Figure 14:
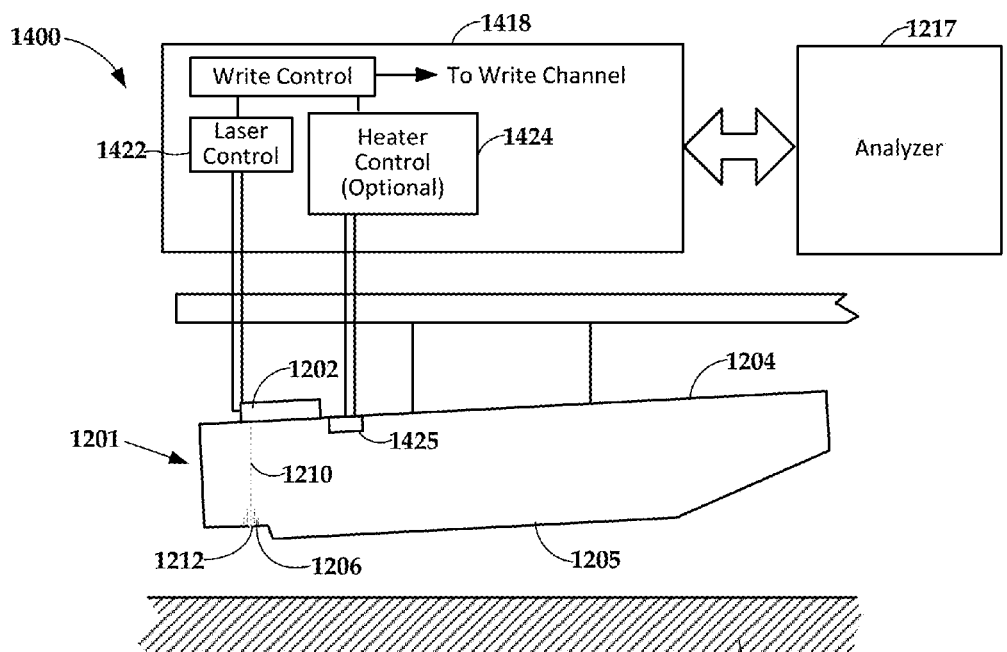
FIG. 14 is a schematic view of an apparatus and related components according to yet another example embodiment.

FIGS. 12-14 are schematic views of apparatuses 1200, 1300, and 1400 (e.g., HAMR apparatuses) and related components that can utilize heating of a junction of a laser diode to reduce laser mode hopping according to various embodiments. FIGS. 12-14 show views of a HAMR configuration according to one example embodiment. In FIGS. 12-14, the configuration is a laser-on-slider (LOS) configuration. Other configurations, such as a laser-in-slider (LIS) configuration are contemplated. Indeed, the embodiments described may be applicable to a variety of energy delivery configurations and laser diode types. In the LOS configuration, each apparatus (slider) 1200, 1300, and 1400 includes a slider body 1201 having an laser diode 1202 mounted to or otherwise disposed adjacent (e.g., with use of a submount) a first surface 1204 thereof. The laser diode 1202 is proximate to a HAMR read/write element 1206, which has one edge on an air bearing surface 1205 of the slider body 1201. The air bearing surface 1205 faces and is held proximate to a moving magnetic recording medium 1211 during device operation.

While here the read/write element 1206 is shown as a single unit, this type of device may have a physically and electrically separate read element (e.g., magnetoresistive stack) and write element (e.g., a write coil and pole) that are located in the same general region of the slider body 1201. The separate read and write portion of the read/write element 1206 may be separately controlled (e.g., having different signal lines, different head-to-media spacing control elements, etc.), although may share some common elements (e.g., common signal return path). It will be understood that the concepts described herein relative to the read/write element 1206 may be applicable to individual read or write portions thereof, and may be also applicable where multiple ones of the read write portions are used, e.g., two or more read elements, two or more write elements, etc.

The laser diode 1202 provides electromagnetic energy to heat the media surface at a point near to the read/write element 1206. Optical path components, such as a waveguide 1210, can be formed integrally within the slider body 1201 to deliver light from the laser diode 1202 to the medium 1211. In particular, a local waveguide and NFT 1212 may be located proximate the read/write element 1206 to provide local heating of the media during write operations. The NFT is designed to support local surface-plasmon at a designed light wavelength. At resonance, high electric field surrounds the NFT due to the collective oscillation of electrons in the metal. Part of the field will tunnel into a storage medium and get absorbed, raising the temperature of the medium locally for recording.

In FIG. 12, the apparatus 1200 can include one or more heater arrangements 1216 configured to warm a junction of the laser diode. The heater arrangement 1216 may be positioned proximate (e.g., adjacent) the laser diode 1202 as illustrated or in other embodiments may be disposed within or along the laser diode itself. In FIG. 12, an analyzer 1217 (e.g., a processor) is illustrated communicating with a controller 1218. The analyzer 1217 can be configured to determine a temperature of the laser diode junction in some instances. Additionally, the analyzer 1217 can determine laser diode power output (e.g., from a photodiode), and compare junction temperature and an injection current supplied during the lasing state to stored combinations of junction temperature and injection current to determine a likelihood of mode hopping occurring for the laser diode during the lasing state. The controller 1218 can communicate with the analyzer and can be configured to vary the current supplied to the heater arrangement for varying a temperature of the junction to reduce the likelihood of mode hopping occurring during the lasing state.

FIG. 12 shows an arrangement where the laser diode 1202 and heater arrangement 1216 are controlled together. Thus, the controller 1218 can be coupled to both the heater arrangement 1216 and the laser diode 1202 to control lasing and to control when the heater arrangement 1216 is on relative to the non-lasing state (and/or the lasing state). Optionally, or in addition, the controller 1218 can be used to control an amount of injection current (power) applied to one or both of the heater arrangement 1216 and the laser diode 1102 to vary a temperature of the junction.

The controller 1218 can include a write control module 1220 that controls various aspects of the device during write operations. For a HAMR device, writing involves activating the laser diode 1202 while writing to the media, which is indicated by way of laser and heater control module 1221. The laser and heater control module 1221 includes circuitry that switches the laser diode 1202 on and off, e.g., in response to a command from write control module 1220. In some embodiments, the laser and heater control 1224 can switch the heater arrangement 1216 on and off inversely to the laser diode 1202 to warm the junction of the laser diode 1202 as discussed with reference to FIGS. 6, 8, and 10. In other embodiments, the laser and heater control 1224 can activate the heating arrangement during at least a portion of the non-lasing state and at least a portion of the lasing state to warm the junction of the laser diode as discussed with reference to FIGS. 6, 8, and 10.

FIG. 13 illustrates an embodiment with a controller 1318 coupled to both the heater arrangement 1216 and the laser diode 1202 to control lasing and to control when the heater arrangement 1216 is on relative to the non-lasing state (and/or the lasing state). The controller 1318 can be coupled to the analyzer 1217, which provides for monitoring as discussed previously. The embodiment of FIG. 13 has a separate laser control 1322 in addition to a heater control 1324. The laser control 1322 and the heater control 1324 can be used to activate the heater arrangement 1216 during (a) the non-lasing state or (b) at least a portion of the non-lasing state and at least a portion of the lasing state to warm the junction of the laser diode 1202.

FIG. 14 illustrates yet another embodiment with a controller 1418 coupled to both the heater arrangement 1216 and the laser diode 1202 to control lasing and to control when the heater arrangement 1216 is on relative to the non-lasing state (and/or the lasing state). The controller 1418 can be coupled to the analyzer 1217, which provides for monitoring as discussed previously. FIG. 14 has a laser control 1422 and a heater control 1424. Although illustrated as two separate modules in FIG. 14, in some embodiments the laser control 1422 and the heater control 1424 can be combined. The heater control 1424 can be coupled to a laser power monitor 1425 (e.g., a photodiode) disposed proximate the laser diode 1202 to allow for monitoring of the junction. In some instances, the laser power monitor 1425 can optionally be disposed sufficiently close to the laser diode 1202 and be configured to warm the junction, and thereby reduce the likelihood of mode hopping. Thus, the laser control 1422 and the heater control 1424 can used to activate the laser power monitor 1425 to provide heating during (a) the non-lasing state or (b) at least a portion of the non-lasing state and at least a portion of the lasing state to warm the junction of the laser diode 1202.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. An apparatus, comprising:
 a laser diode configured to facilitate heat assisted magnetic recording in a lasing state;
 a sensor, coupled in parallel with the laser diode, configured to measure a temperature of a junction of the laser diode and to heat the junction, the sensor configured to heat the junction at least during a non-lasing state of the laser diode; and
 a controller configured to activate the sensor to heat the junction and maintain the junction temperature within a predetermined temperature range associated with a reduced likelihood of mode hopping occurring for the laser diode.

2. The apparatus of claim 1, wherein the sensor comprises at least a diode.

3. The apparatus of claim 1, wherein the sensor comprises a diode in series with a resistive element.

4. The apparatus of claim 3, wherein the resistive element comprises a thermistor.

5. The apparatus of claim 1, wherein the sensor comprises at least a diode configured to be reverse biased during the lasing state and forward biased during the non-lasing state.

6. The apparatus of claim 1, wherein the sensor comprises at least a diode configured to heat the junction of the laser diode during the non-lasing state and during a portion of the lasing state.

7. The apparatus of claim 1, wherein the sensor is configured to be forward biased during the non-lasing state, reverse biased during a first portion of the lasing state, and forward biased during a second portion of the lasing state following the first portion.

8. The apparatus of claim 1, wherein the controller is configured to facilitate rewriting of data recorded on a magnetic recording medium in response to determining that mode hopping was likely to have occurred.

9. The apparatus of claim 1, wherein the controller is configured to modify one or more of an injection current, a laser diode power output, and a head position relative to a magnetic recording medium to compensate for a laser diode power variation due to the mode hopping.

10. The apparatus of claim 1, wherein the controller is configured to adjust heating of the junction via the sensor and adjust an injection current to achieve a junction temperature for which mode hopping is less likely to occur.

11. An apparatus, comprising:
a laser diode configured to facilitate heat assisted magnetic recording in a lasing state;
a sensor comprising at least a diode and coupled in parallel with the laser diode, the sensor configured to measure a temperature of a junction of the laser diode and to heat the junction during a non-lasing state of the laser diode and at least a portion of the lasing state; and
a controller coupled to the laser diode and the sensor, the controller configured to generate a drive signal having an energizing portion and a non-energizing portion to cause the laser diode to operate in the lasing state and a non-lasing state, respectively, the energizing portion comprising a negative-going portion for forward biasing the diode of the sensor during at least the portion of the lasing state;
wherein the controller facilitates heating of the junction to maintain the junction temperature within a predetermined temperature range associated with a reduced likelihood of mode hopping occurring for the laser diode.

12. The apparatus of claim 11, wherein the sensor comprises a diode in series with a resistive element.

13. The apparatus of claim 12, wherein the resistive element comprises a thermistor.

14. The apparatus of claim 11, wherein the diode of the sensor is configured to be reverse biased during most of the lasing state and forward biased during the non-lasing state.

15. The apparatus of claim 11, wherein the diode of the sensor is configured to heat the junction during the non-lasing state and the portion of the lasing state.

16. The apparatus of claim 11, wherein:
the sensor comprises the diode coupled in series with a resistive element; and
the resistive element is configured to heat the junction during the non-lasing state and the portion of the lasing state.

17. The apparatus of claim 11, wherein the diode of the sensor is configured to be forward biased during the non-lasing state, reverse biased during a first portion of the lasing state, and forward biased during a second portion of the lasing state following the first portion.

18. The apparatus of claim 11, wherein the controller is configured to facilitate rewriting of data recorded on a magnetic recording medium in response to determining that mode hopping was likely to have occurred.

19. The apparatus of claim 11, wherein the controller is configured to modify one or more of an injection current, a laser diode power output, and a head position relative to a magnetic recording medium to compensate for a laser diode power variation due to the mode hopping.

20. The apparatus of claim 11, wherein the controller is configured to adjust heating of the junction via the sensor and adjust an injection current to achieve a junction temperature for which mode hopping is less likely to occur.

* * * * *